(12) United States Patent
Saito et al.

(10) Patent No.: US 7,632,382 B2
(45) Date of Patent: Dec. 15, 2009

(54) PLATING APPARATUS

(75) Inventors: Koji Saito, Tokyo (JP); Katsumi Sameshima, Kyoto (JP); Yuuichi Mikata, Yokohama (JP)

(73) Assignees: Ebara Corporation, Tokyo (JP); Rohm Co., Ltd., Kyoto (JP); Kabushiki Kaisha Toshiba, Tokyo (JP)

( * ) Notice: Subject to any disclaimer, the term of this patent is extended or adjusted under 35 U.S.C. 154(b) by 977 days.

(21) Appl. No.: 11/123,176

(22) Filed: May 6, 2005

(65) Prior Publication Data

US 2005/0250324 A1    Nov. 10, 2005

(30) Foreign Application Priority Data

May 7, 2004    (JP)    ............................. 2004-138396

(51) Int. Cl.
  *C25D 5/00*    (2006.01)
  *C25D 17/00*    (2006.01)
(52) U.S. Cl. ........................................ 204/242; 205/96
(58) Field of Classification Search ................. 204/242; 205/96
  See application file for complete search history.

(56) References Cited

U.S. PATENT DOCUMENTS

| | | | |
|---|---|---|---|
| 4,466,864 A * | 8/1984 | Bacon et al. ................ | 205/105 |
| 6,251,236 B1 * | 6/2001 | Stevens ................... | 204/224 R |
| 6,517,689 B1 | 2/2003 | Hongo et al. | |
| 6,632,335 B2 | 10/2003 | Kunisawa et al. | |
| 6,767,437 B2 | 7/2004 | Matsuda et al. | |
| 6,790,763 B2 | 9/2004 | Kondo et al. | |
| 7,273,535 B2 * | 9/2007 | Kovarsky et al. ............ | 204/260 |

* cited by examiner

*Primary Examiner*—Harry D. Wilkins, III
*Assistant Examiner*—Nicholas A. Smith
(74) *Attorney, Agent, or Firm*—Wenderoth, Lind & Ponack, LLP

(57) ABSTRACT

A plating apparatus has a frame configured to be placed on a substrate so that a plating bath is formed by the frame and the substrate. The frame includes a conductive core and a seal member covering the conductive core. The plating apparatus also has a non-conductive porous member configured to be immersed in an electrolytic plating solution held in the plating bath, a counter electrode disposed on the non-conductive porous member so as to face the substrate with a predetermined distance from the substrate, and a feed contact configured to be brought into contact with a peripheral portion of the substrate outside of the frame. The plating apparatus includes a power source operable to apply a voltage between the counter electrode and the substrate and a potential adjuster operable to control a potential of the conductive core of the frame with respect to a potential of the substrate.

10 Claims, 4 Drawing Sheets

F I G. 5
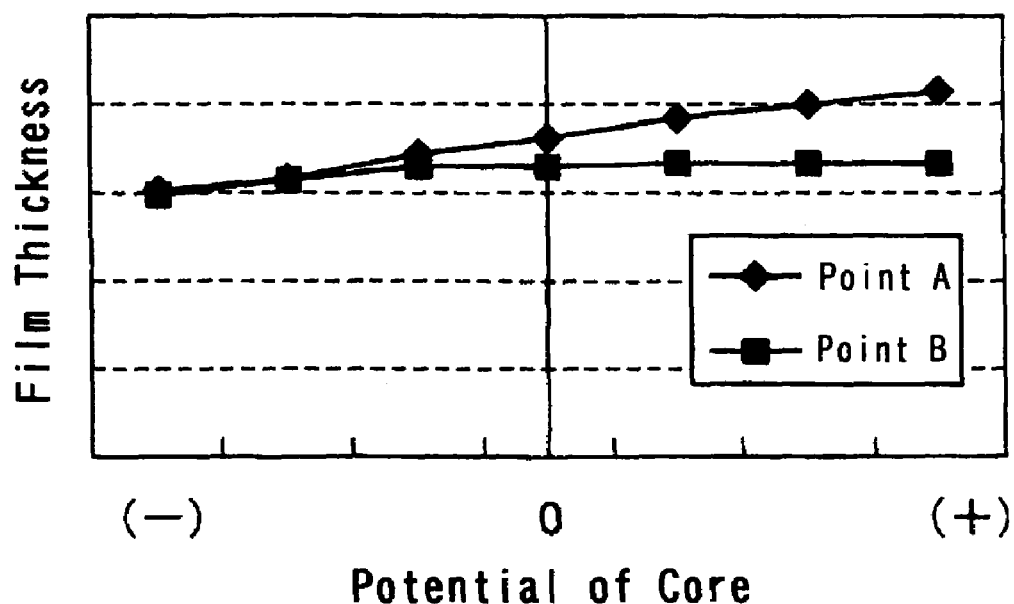

PLATING APPARATUS

BACKGROUND OF THE INVENTION

1. Field of the Invention

The present invention relates to a plating apparatus, and more particularly to an electrode structure in a plating apparatus for plating a substrate such as a semiconductor wafer. The present invention also relates to a method of forming a conductive film on a substrate such as a semiconductor wafer.

2. Description of the Related Art

As semiconductor devices have become more highly integrated in recent years, circuit interconnections have become finer and distances between those circuit interconnections have become smaller. In the case of photolithography, which can form interconnections that are at most 0.5 μm wide, it is required that surfaces on which pattern images are to be focused by a stepper should be as flat as possible because the depth of focus of an optical system is relatively small. In order to planarize such a semiconductor wafer, there has been used a polishing apparatus for performing chemical mechanical polishing (CMP).

Prior to the CMP process, a metal plating process such as a copper plating process is performed to fill metal into fine interconnection grooves or recesses formed in a surface of a semiconductor wafer. At that time, it is important to form a plated film having uniform thickness. FIG. 1 shows a conventional plating apparatus 1 which can form a plated film having uniform thickness on a semiconductor device for LSI, which has fine interconnections having a multilayer structure.

The conventional plating apparatus 1 shown in FIG. 1 is used to deposit a copper film on a seed layer 2 formed on an upper surface of a substrate such as a semiconductor wafer 3 by electrolytic plating. As shown in FIG. 1, the plating apparatus 1 has a wafer chuck 4 for chucking the semiconductor wafer 3 in a state such that the semiconductor wafer 3 faces upward, a plating cup 5 which covers the semiconductor wafer 3 so that an open end of the plating cup 5 is closed by the semiconductor wafer 3, a seal member 6 for sealing the semiconductor wafer 3 and the plating cup 5, and a counter electrode 7 disposed so as to face the semiconductor wafer 3. The counter electrode 7 is spaced from the semiconductor wafer 3 at a predetermined distance. The plating apparatus 1 includes a power source 8 for supplying current to the semiconductor wafer 3 and the counter electrode 7 so that the seed layer 2 of the semiconductor wafer 3 serves as a cathode while the counter electrode 7 serves as an anode. The open end of the plating cup 5 is closed by the semiconductor wafer 3, and an electrolytic plating solution 9 is supplied to the interior of the plating cup 5. The semiconductor wafer 3 and the counter electrode 7 are electrically connected via the electrolytic plating solution 9 in the plating cup 5 to thereby form a copper film on the seed layer 2 of the semiconductor wafer 3. In the conventional plating apparatus 1, current is supplied to the semiconductor wafer 3 via a mechanical contact with a conductive portion (seed layer) of the semiconductor wafer 3.

The conventional plating apparatus 1 as shown in FIG. 1 requires a large amount of electrolytic plating solution to plate a substrate such as a semiconductor wafer. Thus, the conventional plating apparatus 1 is uneconomical even though it can form a plated film having uniform thickness. Recently, there has been proposed a plating apparatus which can avoid wasteful use of an electrolytic plating solution. FIG. 2 shows such a plating apparatus 11 which can reduce the amount of electrolytic plating solution to be used.

As shown in FIG. 2, the plating apparatus 11 includes a frame (wafer seal) 12 positioned on a peripheral portion of a semiconductor wafer 3, which has a seed layer formed on an upper surface thereof. The semiconductor wafer 3 is disposed so that the seed layer faces upward. The frame 12 is formed by a seal member 13 made of synthetic rubber or synthetic resin having elasticity and chemical resistance. Thus, the frame 12 has a sealing capability. Accordingly, the frame 12 and the semiconductor wafer 3 define a plating bath in the form of a flat dish for holding an electrolytic plating solution 9 therein. The plating apparatus 11 also includes an immersion member 14 which is immersed in the electrolytic plating solution 9 held in the plating bath, a holder 15 for holding the immersion member 14 so as to immerse the immersion member 14 in the electrolytic plating solution 9, a shield rubber ring 16 interposed between the immersion member 14 and the holder 15, and a counter electrode 17 disposed on an upper surface of the immersion member 14. The immersion member 14 is used to increase an electrical resistance between the semiconductor wafer 3 and the counter electrode 17 for uniform plating. The counter electrode 17 is spaced from the semiconductor wafer 3 at a predetermined distance so as to be in parallel to a surface of the semiconductor wafer 3. It is desirable to bring the counter electrode 17 into close contact with the upper surface of the immersion member 14.

The plating apparatus 11 has a feed contact 18 for supplying current from a power source to the seed layer (conductive portion) of the semiconductor wafer 3. The feed contact 18 is positioned outside of a packing portion 19 of the frame 12 and brought into contact with a peripheral portion of the semiconductor wafer 3 which extends outward from the packing portion 19 of the frame 12. Thus, the conductive portion (seed layer) of the semiconductor wafer 3 and the feed contact 18 are electrically connected to each other. The packing portion 19 of the frame 12 has a tip end which is pressed against the surface of the semiconductor wafer 3 and brought into close contact with the surface of the semiconductor wafer 3. Thus, the frame 12 serves to prevent the electrolytic plating solution 9 from leaking out of the packing portion 19 of the frame 12. Accordingly, the feed contact 18 is prevented from being exposed to the electrolytic plating solution 9.

In the plating apparatus 11 shown in FIG. 2, the immersion member 14 is formed of non-conductive open-cell foam. Accordingly, the immersion member 14 has a large number of fine passages in the foam, into which a plating solution is introduced. Thus, fine current paths are formed in the immersion member 14 so that the immersion member 14 has a high resistivity.

One of reasons why the immersion member 14 is interposed between the counter electrode 17 and the semiconductor wafer 3 is to reduce the amount of electrolytic plating solution to be used. However, a primary reason for the above is to increase an electrical resistance so as to form a plated film having uniform thickness on the substrate (semiconductor wafer) 3.

Specifically, in a case of a low electrical resistance between the counter electrode (anode) 17 and the semiconductor wafer 3, current is concentrated near the feed contact 18 on the peripheral portion of the semiconductor wafer 3 because the seed layer formed on the semiconductor wafer 3 has a high electrical resistance. Accordingly, a resistor (i.e., immersion member) having an electrical resistance higher than the seed layer of the semiconductor wafer 3 should be interposed between the counter electrode 17 and the semiconductor wafer 3 to form a plated film having uniform thickness.

However, when the frame 12 is formed by the non-conductive seal member 13, electric fields are still concentrated near the feed contact 18 on the peripheral portion of the semiconductor wafer 3 as shown by arrows in FIG. 2 even if the immersion member 14 having a high resistivity is interposed between the counter electrode 17 and the semiconductor wafer 3. Accordingly, a plated film having uneven thickness is formed on the semiconductor wafer 3.

According to the plating apparatus shown in FIG. 2, the immersion member 14 is immersed in the electrolytic plating solution 9 by the holder 15 to increase an electrical resistance between the counter electrode 17 and the semiconductor wafer 3. Thus, it is possible to form a plated film having uniform thickness on the semiconductor wafer 3 and considerably reduce the amount of electrolytic plating solution to be used as compared to the conventional plating apparatus 1 shown in FIG. 1. However, since the peripheral portion of the semiconductor wafer 3 extends outward from the packing portion 19 of the frame 12 as seen from FIG. 2, the electrolytic plating solution 9 is not brought into contact with the peripheral portion of the semiconductor wafer 3. Thus, an area of the semiconductor wafer 3 to be plated becomes small.

Additionally, the diameter of the immersion member 14 is considerably smaller than that of the semiconductor wafer 3. Accordingly, an area of the semiconductor wafer 3 on which the electrolytic plating solution 9 is present inside of the packing portion 19 of the frame 12 includes an inner area above which the counter electrode 17 is present and an outer area above which the counter electrode 17 is not present. At that time, the outer area of the semiconductor wafer 3 is likely to be insufficiently plated. Thus, an effective area of the semiconductor wafer 3 to be plated becomes small.

According to the conventional plating apparatus 1 using no immersion member, as shown in FIG. 1, a current density is not uniform on the semiconductor wafer 3 because of a long distance between the semiconductor wafer 3 and the counter electrode 7. According to the improved conventional plating apparatus 11 having the immersion member 14 to reduce an effective distance between the semiconductor wafer 3 and the counter electrode 17, as shown in FIG. 2, uniformity of the thickness of the plated film is achieved to some extent. However, disturbance of electric fields is generated at ends of the immersion member 14. Accordingly, the thickness of the plated film is different between a central portion and an edge portion of the semiconductor wafer 3. In a case of an applied voltage of 0 V, the film thickness of the edge portion of the semiconductor wafer 3 is larger than that of the central portion of the semiconductor wafer 3. Some areas have a film thickness smaller than the film thickness of the central portion. Thus, the thickness of the plated film becomes uneven on the semiconductor wafer 3.

Further, the conventional plating apparatus has a wafer chuck (not shown in FIG. 2) and an annular member (not shown in FIG. 2) disposed on a lower surface of the semiconductor wafer 3 so as to face the frame 12. The frame 12 is clamped by the wafer chuck and the annular member to bring the packing portion 19 of the frame 12 into close contact with the semiconductor wafer 3. Thus, the electrolytic plating solution 9 is prevented from leaking out of the frame 12. Accordingly, an excessive force is applied to the peripheral portion of the semiconductor wafer 3. As a result, the seal member 13 is twisted at the time of clamping so as to inhibit a plated film formed on the semiconductor wafer 3 from having uniform thickness.

SUMMARY OF THE INVENTION

The present invention has been made in view of the above drawbacks. It is, therefore, a first object of the present invention to provide a plating apparatus which can remarkably reduce the amount of electrolytic plating solution to be used and can form a plated film having uniform thickness over an entire surface of a substrate on which an electrolytic plating solution is present.

A second object of the present invention is to provide a method of forming a conductive film on a substrate which can remarkably reduce the amount of electrolytic plating solution to be used and can form a plated film having uniform thickness over an entire surface of a substrate on which an electrolytic plating solution is present.

The inventors have devoted themselves to their study and discovered that a frame including a conductive core covered by a seal member made of fluororubber or the like is effective to achieve the above object. When a potential of the conductive core is properly adjusted with respect to a potential of a substrate, a plated film having uniform thickness can be formed over an entire surface of a substrate on which an electrolytic plating solution is present. The present invention has been made based on the above findings.

Specifically, according to a first aspect of the present invention, there is provided a plating apparatus which can remarkably reduce the amount of electrolytic plating solution to be used and can form a plated film having uniform thickness over an entire surface of a substrate on which an electrolytic plating solution is present. The plating apparatus has a frame configured to be placed on a substrate so that a plating bath is formed by the frame and the substrate. The frame includes a conductive core and a seal member covering the conductive core. The plating apparatus also has a non-conductive porous member configured to be immersed in an electrolytic plating solution held in the plating bath, a counter electrode disposed on the non-conductive porous member so as to face the substrate with a predetermined distance from the substrate, and a feed contact configured to be brought into contact with a peripheral portion of the substrate outside of the frame. The plating apparatus includes a power source operable to apply a voltage between the counter electrode and the substrate and a potential adjuster operable to control a potential of the conductive core of the frame with respect to a potential of the substrate.

According to a second aspect of the present invention, there is provided a method of forming a conductive film on a substrate which can remarkably reduce the amount of electrolytic plating solution to be used and can form a plated film having uniform thickness over an entire surface of a substrate on which an electrolytic plating solution is present. A frame is placed on a substrate so that a plating bath is formed by the frame and the substrate. The frame includes a conductive core and a seal member covering the conductive core. An electrolytic plating solution is held in the plating bath. A non-conductive porous member is immerses in the electrolytic plating solution held in the plating bath. A counter electrode is disposed on the non-conductive porous member so as to face the substrate with a predetermined distance from the substrate. A feed contact is brought into contact with a peripheral portion of the substrate outside of the frame. A voltage is applied between the counter electrode and the substrate. A potential of the conductive core of the frame is adjusted with respect to a potential of the substrate.

According to the present invention, since the potential of the conductive core of the frame is adjusted with respect to a potential of the counter electrode or the substrate, the conductive core of the frame serves as an auxiliary electrode. When the conductive core has a potential lower than the substrate such as a silicon wafer, strong electric fields are generated from the counter electrode to the conductive core. Accordingly, it is possible to prevent current from being concentrated near the feed contact disposed at a peripheral portion of the substrate. When the conductive core has a potential higher than the substrate, a considerable amount of electric fields is emitted from the conductive core toward a peripheral portion of the substrate. As a result, an emission current from the counter electrode can effectively be prevented from being concentrated on the substrate near the feed contact.

Thus, the conductive core of the frame (wafer seal) having a potential higher or lower than a potential of the substrate can prevent concentration of an emission current to the feed contact because the conductive core serves as an auxiliary electrode. As a result, a plated film having uniform thickness can be formed from a peripheral point to a central point of the semiconductor wafer, i.e., over the entire surface of the substrate.

As described above, a first effect of preventing concentration of an emission current to the feed contact is achieved by the conductive core, which serves as an auxiliary electrode. Further, an electrolytic plating solution is introduced into a large number of fine passages in the non-conductive porous member so as to form current paths having an electrical resistance higher than an electrical resistance of the seed layer of the substrate. Thus, a second effect of preventing concentration of an emission current to the feed contact is achieved by the non-conductive porous member. Accordingly, a plated film having uniform thickness, which has not been achieved by the prior art, can be formed over the entire surface of the substrate by a multiplier effect of the aforementioned first and second effects.

As described above, a plating apparatus according to the present invention can form a plated film having uniform thickness on a surface of a substrate. Accordingly, the present invention can suitably be used for a plating apparatus in fields of manufacturing devices having a mirror finished surface which require to deposit a uniform metal film on a substrate such as a semiconductor wafer, a quartz substrate, or a glass substrate. Further, a plating apparatus according to the present invention can form a plated film having uniform thickness over the entire surface of the substrate. Accordingly, the present invention is suitable for manufacturing semiconductor devices for LSI, which are used in multifunctional electric equipment that requires compactness and high performance.

The above and other objects, features, and advantages of the present invention will be apparent from the following description when taken in conjunction with the accompanying drawings which illustrate preferred embodiments of the present invention by way of example.

BRIEF DESCRIPTION OF THE DRAWINGS

FIG. 5 is a graph showing a distribution of thicknesses of a plated film.

DETAILED DESCRIPTION OF THE PREFERRED EMBODIMENTS

Figure 1:
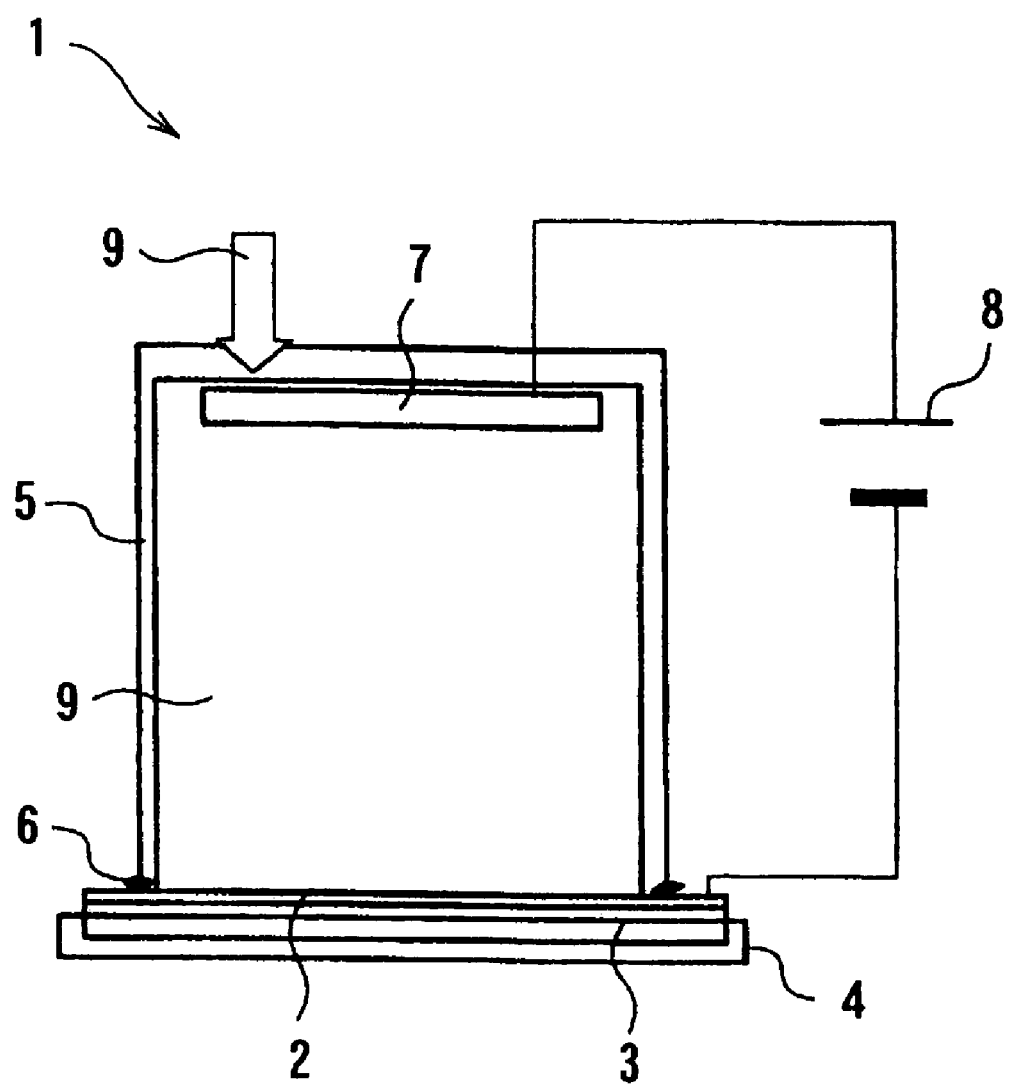
FIG. 1 is a schematic view showing a conventional plating apparatus.
Figure 2:
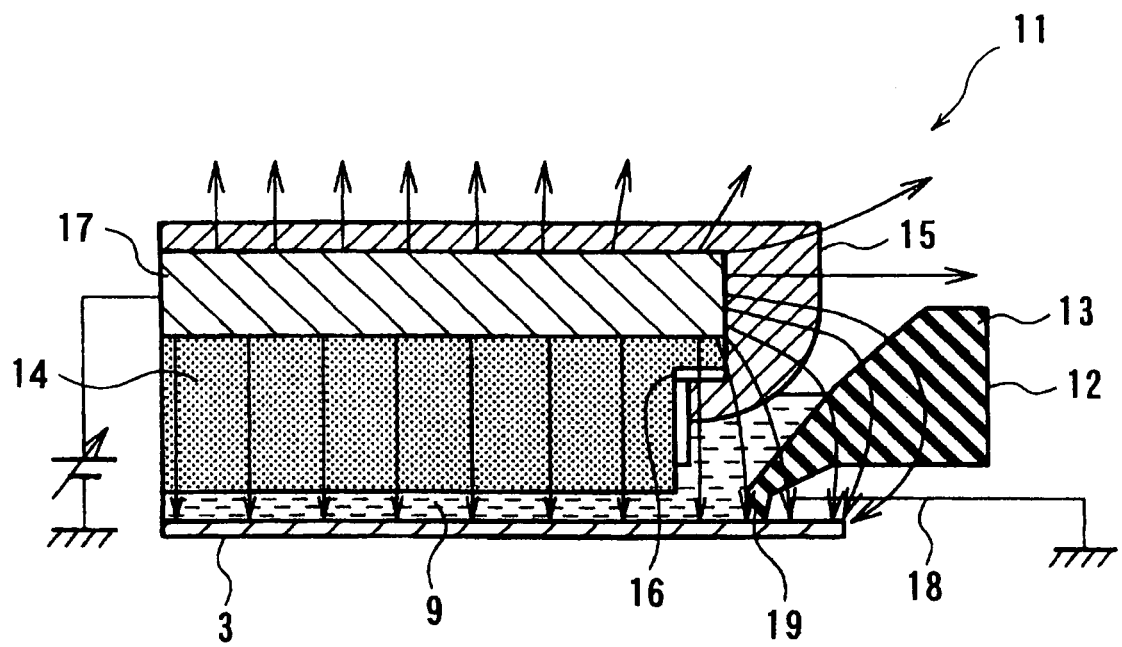
FIG. 2 is a cross-sectional view showing a main portion of a conventional plating apparatus capable of reducing the amount of electrolytic plating solution to be used.

A plating apparatus according to embodiments of the present invention will be described below with reference to FIGS. 3 through 5. Like or corresponding parts are denoted by like or corresponding reference numerals throughout drawings, and will not be described below repetitively.

Figure 3:
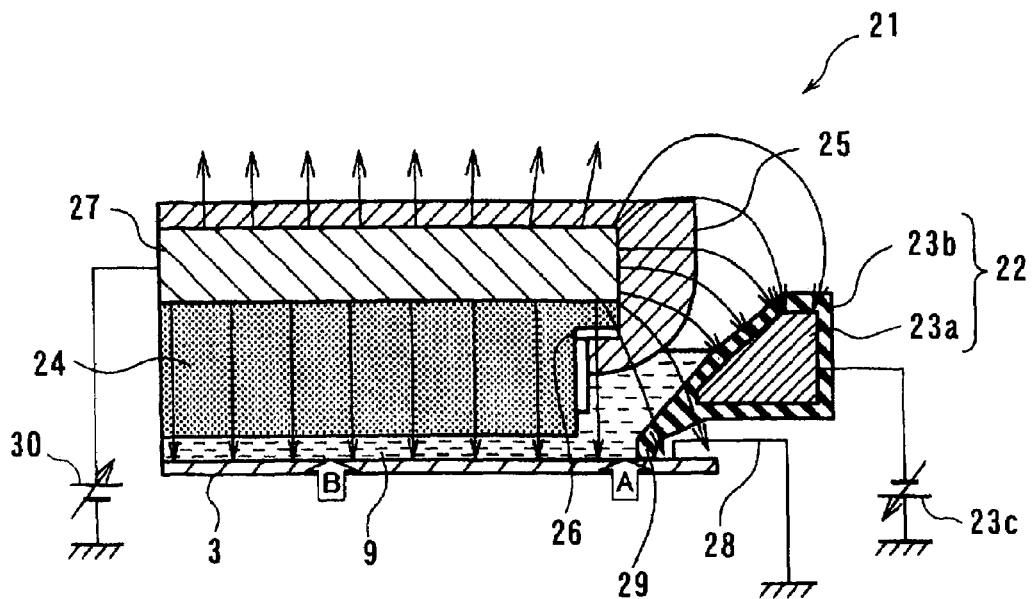
FIG. 3 is a cross-sectional view showing a main portion of a plating apparatus according to a first embodiment of the present invention.

FIG. 3 is a cross-sectional view showing a main portion of a plating apparatus 21 according to a first embodiment of the present invention. The plating apparatus 21 can form a copper film on a semiconductor device for LSI, which has fine interconnections having a multilayer structure for the purposes of increase of speed and reduction of electric power consumption, by electrolytic plating As shown in FIG. 3, the plating apparatus 21 has an annular frame (wafer seal) 22 positioned on a peripheral portion of a semiconductor wafer 3, which has a seed layer formed on an upper surface thereof. The semiconductor wafer 3 is disposed so that the seed layer faces upward. The frame 22 includes a metal core 23a and a seal member 23b made of synthetic rubber or synthetic resin having elasticity and chemical resistance. For example, the seal member 23b may comprise annular fluororubber. The seal member 23b covers the metal core 23a to form the frame 22. Accordingly, the frame 22 and the semiconductor wafer 3 define a plating bath in the form of a flat dish for holding an electrolytic plating solution 9 therein. The plating apparatus 21 also includes an immersion member (non-conductive porous member) 24 which is immersed in the electrolytic plating solution 9 held in the plating bath, a holder 25 for holding the immersion member 24 so as to forcibly immerse the immersion member 24 in the electrolytic plating solution 9, a shield rubber ring 26 interposed between the immersion member 24 and the holder 25, and a counter electrode 27 disposed on an upper surface of the immersion member 24. The immersion member 14 is used to increase an electrical resistance between the semiconductor wafer 3 and the counter electrode 27 for uniform plating. The counter electrode 27 is spaced from the semiconductor wafer 3 at a predetermined distance so as to be in parallel to a surface of the semiconductor wafer 3. It is desirable to bring the counter electrode 27 into close contact with the upper surface of the immersion member 24.

The plating apparatus 21 has a plurality of feed contacts 28 for supplying current from a power source 30 to the seed layer (conductive portion) of the semiconductor wafer 3. The feed contacts 28 are positioned outside of a packing portion 29 of the frame 22 and brought into contact with a peripheral portion of the semiconductor wafer 3 which extends outward from the packing portion 29 of the frame 22. Thus, the conductive portion (seed layer) of the semiconductor wafer 3 and the feed contacts 28 are electrically connected to each other. The packing portion 29 of the frame 22 has a tip end which is pressed against the surface of the semiconductor wafer 3 and brought into close contact with the surface of the semiconductor wafer 3. Thus, the frame 22 serves to prevent the electrolytic plating solution 9 from leaking out of the packing portion 29 of the frame 22. Accordingly, the feed contacts 28 are prevented from being exposed to the electrolytic plating solution 9.

The plating apparatus 21 includes the power source 30 for applying a voltage between the semiconductor wafer 3 and the counter electrode 27 so that the seed layer of the semiconductor wafer 3 serves as a cathode while the counter electrode 27 serves as an anode. The plating bath is defined by the semiconductor wafer 3 and the frame (wafer seal) 22, and an electrolytic plating solution 9 is supplied into the plating bath. The semiconductor wafer 3 and the counter electrode 7 are electrically connected via the electrolytic plating solution 9 in the plating bath to thereby form a copper film on a surface of the semiconductor wafer 3.

The plating apparatus 21 includes a potential adjuster 23c for controlling a potential of the conductive core 23a of the frame 22 with respect to a potential of the semiconductor wafer 3. As shown in FIG. 3, the potential adjuster 23c is connected to the conductive core 23a. The potential adjuster 23c may be configured to adjust the potential of the conductive core 23a so as to be higher or lower than the potential of semiconductor wafer 3, the counter electrode 27, or the holder 25.

The immersion member 24 should be configured to reduce the amount of electrolytic plating solution 9 received in the plating bath defined by the semiconductor wafer 3 and the frame (wafer seal) 22. Further, the immersion member 24 should be configured to form current paths having a high electrical resistance. Any member can be used as the immersion member 24 as long as it meets the above requirements. For example, a member having a specific gravity larger than that of the electrolytic plating solution 9 is suitable for the immersion member 24 because any weight is not required to immerse the immersion member 24 in the electrolytic plating solution 9. However, if the immersion member 24 is excessively heavy, it cannot readily be handled. Accordingly, from the viewpoint of weight reduction, the immersion member 24 preferably comprises a porous member. Such a porous member should have continuous passages formed therein to form current paths. For example, non-conductive synthetic resin, rubber, or ceramics can suitably be used for the porous member of the immersion member 24. Particularly, porous ceramics are suitable materials for the immersion member 24 because ceramics have high corrosion resistances and proper specific gravities. For example, porous ceramics include foam glass and sintered ceramic compacts.

The seal member 23b is brought into close contact with the semiconductor wafer 3 to prevent the electrolytic plating solution 9 from leaking out of the plating bath defined by the semiconductor wafer 3 and the frame (wafer seal) 22. For example, elastic materials such as synthetic rubber or synthetic rubber are suitably used for the seal member 23b. Particularly, fluororubber is preferably used for the seal member 23b because it has an excellent elastic restitution coefficient, heat resistance, and chemical resistance. Fluororubber includes tetrafluoropropylene, copolymers of chlorotrifluoroethylene and vinylidene fluoride, copolymers of tetrafluoroethylene-propylene, fluoroacrylate, fluoropolyester, and phosphazene.

In the plating apparatus 21, the frame (wafer seal) 22 is placed on and brought into close contact with the peripheral portion of the semiconductor wafer 3. Current is supplied to the semiconductor wafer 3 by a plurality of feed contacts 6 that are brought into contact with a peripheral portion of the semiconductor wafer 3 extending outward from the packing portion 29 of the frame 22. The feed contacts 6 are arranged so as to surround the semiconductor wafer 3. Specifically, the feed contacts 6 are arranged at equal intervals over the entire circumferential areas of the semiconductor wafer 3 so as to provide point contacts or line contacts with the seed layer formed on the peripheral portion of the semiconductor wafer 3.

The frame (wafer seal) 22 placed on the semiconductor wafer 3 has a height large enough to afford to hold the electrolytic plating solution 9 when a liquid level of the electrolytic plating solution 9 is raised by immersion of the immersion member 24. The frame 22 has an inner tapered wall. A lower portion of the inner tapered wall is formed by the seal member 23b. The feed contacts 28 are brought into contact with the semiconductor wafer 3. The feed contacts 28 are made of copper or metal nobler than copper, such as gold, silver, or platinum.

When the frame 22 is brought into close contact with and held on the peripheral portion of the semiconductor wafer 3, the feed contacts 28 are brought into contact with the peripheral portion of the seed layer of the semiconductor wafer 3 to supply current to the seed layer from the peripheral portion of the semiconductor wafer 3.

In the plating apparatus 21, uniform and stable current density distribution can be provided by a plurality of feed contacts 28 arranged at equal intervals to supply current to the surface of the semiconductor wafer 3 from the peripheral portion of the semiconductor wafer 3, in cooperation with the counter electrode 27 disposed above the porous immersion member 24 and with the frame (wafer seal) 22, which serves as an auxiliary electrode controlled in potential. Accordingly, the plating apparatus 21 can form a copper film having uniform thickness on the seed layer of the substrate (semiconductor wafer) 3 by electrolytic plating.

Next, there will be described a current from the counter electrode (anode) 27 to the semiconductor wafer 3 in the plating apparatus 21. FIG. 3 illustrates directions of electric fields in the plating apparatus 21 when the frame (wafer seal) 22 has a potential lower than the semiconductor wafer 3. As indicated by arrows in FIG. 3, electric fields from the counter electrode 27 include first electric fields directed to the semiconductor wafer 3 through the current paths in the porous immersion member 24, second electric fields emitted from the counter electrode 27 to the exterior of the plating apparatus 21, and third electric fields directed to the conductive core 23a in the frame 22 which serves as an auxiliary electrode controlled in potential by the potential adjuster 23c. All electric fields from ends of the counter electrode 27 are directed to the conductive core 23a or the vicinity of the feed contacts 28. Thus, uniform electric fields are directed to a surface of the semiconductor wafer 3 on which the plating solution 8 is present. As a result, a plated film having uniform thickness can be formed from a peripheral point B to a central point A of the semiconductor wafer 3.

Figure 4:
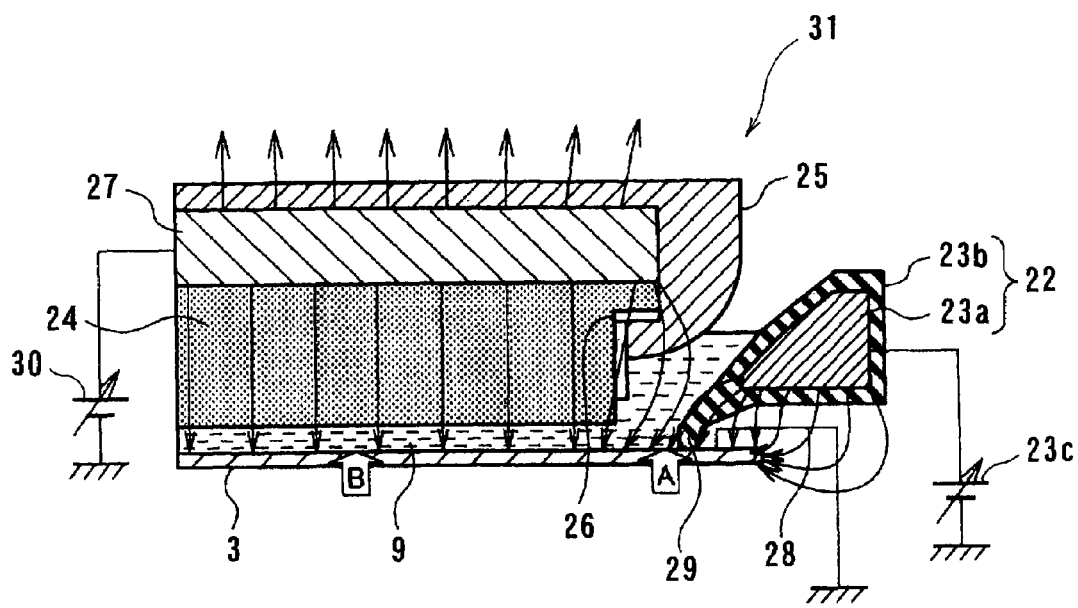
FIG. 4 is a cross-sectional view showing a main portion of a plating apparatus according to a second embodiment of the present invention.

FIG. 4 is a cross-sectional view showing a main portion of a plating apparatus 31 according to a second embodiment of the present invention. The plating apparatus 31 shown in FIG. 4 differs from the plating apparatus 21 shown in FIG. 3 in that the semiconductor wafer 3 and the conductive core 23a have reversed potentials. Other arrangements are the same as the plating apparatus 21 shown in FIG. 3 and will not be described repetitively.

In the plating apparatus 31, as indicated by arrows in FIG. 4, electric fields from the counter electrode 27 include first electric fields directed to the semiconductor wafer 3 through the current paths in the porous immersion member 24, second electric fields emitted from the counter electrode 27 to the exterior of the plating apparatus 21, and third electric fields bypassing the immersion member 24 to the point A. Additionally, electric fields from the conductive core 23a of the frame 22 include first electric fields directed to a peripheral portion of the semiconductor wafer 3 outside of the packing portion 23, and second electric fields directed to the point A. Thus, a potential of the emission current from the conductive core 23a is mixed into the bypassing current flowing from the counter electrode 27 to the vicinity of the point A of the semiconductor wafer 3. Accordingly, the plating apparatus 31 shown in FIG. 4 is less effective than the plating apparatus 21 shown in FIG. 3. Nevertheless, a plated film having substantially uniform thickness can be formed from the peripheral point B to the central point A of the semiconductor wafer 3.

FIG. 5 shows a distribution of thicknesses of a plated film formed by the plating apparatuses shown in FIGS. 3 and 4. In FIG. 5, thicknesses of a plated film formed when the semiconductor wafer 3 and the conductive core 23a had the same potential of 0 V are drawn at the center of the horizontal axis. Thicknesses of a plated film formed when the conductive core 23a had a potential lower than the semiconductor wafer 3 are drawn at the left side on the horizontal axis. Thicknesses of a plated film formed when the conductive core 23a had a potential higher than the semiconductor wafer 3 are drawn at the right side on the horizontal axis.

Although certain preferred embodiments of the present invention have been shown and described in detail, it should be understood that various changes and modifications may be made therein without departing from the scope of the appended claims.

What is claimed is:

1. A plating apparatus comprising:
   a frame configured to be placed on a substrate so that a plating bath is formed by said frame and the substrate, said frame including a conductive core and a seal member covering said conductive core;
   a non-conductive porous member configured to be immersed in an electrolytic plating solution held in the plating bath;
   a counter electrode disposed on said non-conductive porous member so as to face the substrate with a predetermined distance from the substrate;
   a feed contact configured to be brought into contact with a peripheral portion of the substrate outside of said frame;
   a power source operable to apply a voltage between said counter electrode and the substrate; and
   a potential adjuster operable to control a potential of said conductive core of said frame with respect to a potential of the substrate.

2. The plating apparatus as recited in claim 1, wherein said power source is operable to apply the voltage so that the substrate serves as a cathode while said counter electrode serves as an anode.

3. The plating apparatus as recited in claim 1, wherein said potential adjuster is operable to adjust the potential of said conductive core of said frame so as to be lower than the potential of the substrate.

4. The plating apparatus as recited in claim 1, wherein said potential adjuster is operable to adjust the potential of said conductive core of said frame so as to be higher than the potential of the substrate.

5. The plating apparatus as recited in claim 1, further comprising a holder configured to hold said non-conductive porous member and said counter electrode.

6. The plating apparatus as recited in claim 5, wherein said potential adjuster is operable to adjust the potential of said conductive core of said frame with respect to a potential of said holder.

7. The plating apparatus as recited in claim 1, wherein said potential adjuster is operable to adjust the potential of said conductive core of said frame with respect to a potential of said counter electrode.

8. The plating apparatus as recited in claim 1, wherein said seal member comprises fluororubber.

9. The plating apparatus as recited in claim 1, wherein said non-conductive porous member is formed of non-conductive open-cell foam.

10. The plating apparatus as recited in claim 1, wherein said non-conductive porous member is formed of a porous ceramic.

* * * * *